United States Patent
Lee et al.

(10) Patent No.: US 10,262,719 B1
(45) Date of Patent: Apr. 16, 2019

(54) DRAM AND REFRESH METHOD THEREOF

(71) Applicant: NANYA TECHNOLOGY CORPORATION, New Taipei (TW)

(72) Inventors: Chung-Hsun Lee, New Taipei (TW); Hsien-Wen Liu, Luzhu Township, Taoyuan County (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 15/868,417

(22) Filed: Jan. 11, 2018

Related U.S. Application Data

(60) Provisional application No. 62/609,721, filed on Dec. 22, 2017.

(51) Int. Cl.
  *G11C 11/406* (2006.01)
  *G11C 11/408* (2006.01)

(52) U.S. Cl.
  CPC ...... *G11C 11/40615* (2013.01); *G11C 11/408* (2013.01); *G11C 11/40611* (2013.01)

(58) Field of Classification Search
  CPC ......... G11C 11/40615; G11C 11/40611; G11C 11/408
  USPC ........................................................ 365/149
  See application file for complete search history.

(56) References Cited

U.S. PATENT DOCUMENTS

| | | | | |
|---|---|---|---|---|
| 6,778,461 | B2 * | 8/2004 | Grasso | G11C 7/1018 |
| | | | | 365/189.04 |
| 9,087,602 | B2 * | 7/2015 | Youn | G11C 11/40615 |
| 9,704,558 | B2 * | 7/2017 | Doo | G11C 11/4091 |
| 2014/0355332 | A1 * | 12/2014 | Youn | G11C 11/40615 |
| | | | | 365/149 |
| 2017/0117033 | A1 * | 4/2017 | Doo | G11C 11/4091 |
| 2017/0316818 | A1 * | 11/2017 | Saifuddin | G11C 11/40615 |

* cited by examiner

*Primary Examiner* — Xiaochun L Chen
(74) *Attorney, Agent, or Firm* — Muncy, Geissler, Olds & Lowe, P.C.

(57) ABSTRACT

The present disclosure provides a dynamic random access memory (DRAM) and a method of operating the same. The DRAM includes a memory array, a refresh device and an access device. The refresh device is configured to perform a self-refresh operation on the memory array, wherein the self-refresh operation is interrupted in response to an access command. The access device is configured to access the memory array in response to the access command and the interruption of the self-refresh operation.

14 Claims, 10 Drawing Sheets

DRAM AND REFRESH METHOD THEREOF

PRIORITY CLAIM AND CROSS-REFERENCE

This application claims the benefit of provisional application Ser. 62/609,721 filed on Dec. 22, 2017, entitled "DRAM" the disclosure of which is hereby incorporated by reference in its entirety.

TECHNICAL FIELD

The present disclosure relates to a dynamic random access memory (DRAM) and a method of operating the same, and more particularly, to management of a refresh operation of a DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a dynamic random access memory (DRAM). The DRAM comprises a memory array, a refresh device and an access device. The refresh device is configured to perform a self-refresh operation on the memory array, wherein the self-refresh operation is interrupted in response to an access command. The access device is configured to access the memory array in response to both the interruption of the self-refresh operation and the access command.

In some embodiments, the refresh device is configured to be instructed, by a processor external to the DRAM, to perform a controlled refresh operation on the memory array in response to completion of executing the access command.

In some embodiments, the refresh device is configured to re-perform the self-refresh operation in response to completion of the controlled refresh operation.

In some embodiments, the memory array includes a refresh unit, wherein the self-refresh operation is interrupted in response to completion of the self-refresh operation currently being performed on the refresh unit.

In some embodiments, the memory array includes a first refresh unit and a second refresh unit. The first refresh unit is in a first place of a refresh schedule. The second refresh unit is in a second place of the refresh schedule, wherein the second place follows the first place. The self-refresh operation is interrupted in response to completion of the self-refresh operation currently being performed on the first refresh unit. The refresh device is further configured to be instructed, by a processor external to the DRAM, to perform a controlled refresh operation on the second refresh unit in response to completion of executing the access command.

In some embodiments, the refresh device is configured to re-perform the self-refresh operation in response to completion of the controlled refresh operation performed on the second refresh unit.

In some embodiments, the DRAM is configured to provide, to the processor, an address associated with the second refresh unit. The DRAM is configured to receive the address from the processor in response to a receipt of a request to perform the controlled refresh operation. The refresh device is further configured to be instructed to perform the controlled refresh operation on the second refresh unit according to the address.

In some embodiments, the refresh device is configured to re-perform the self-refresh operation in response to completion of the controlled refresh operation performed on the second refresh unit.

In some embodiments, the DRAM further comprises a control device. The control device is configured to actively provide the address to the processor in response to the interruption of the self-refresh operation.

In some embodiments, the DRAM further comprises a control device. The control device is configured to passively provide the address to the processor in response to the interruption of the self-refresh operation.

Another aspect of the present disclosure provides a method of operating a dynamic random access memory (DRAM). The method comprises: performing a self-refresh operation on a memory array; interrupting the self-refresh operation in response to an access command; and accessing the memory array in response to both the interruption of the self-refresh operation and the access command.

In some embodiments, the method further comprises: receiving an instruction, from a processor external to the DRAM, to perform a controlled refresh operation on the memory array in response to completion of executing the access command.

In some embodiments, the method further comprises: re-performing the self-refresh operation in response to completion of the controlled refresh operation.

In some embodiments, the method further comprises: interrupting the self-refresh operation in response to completion of the self-refresh operation currently being performed on a refresh unit.

In some embodiments, the method further comprises: interrupting the self-refresh operation in response to completion of the self-refresh operation currently being performed on a first refresh unit in a first place of a refresh schedule; and receiving an instruction, from a processor external to the DRAM, to perform a controlled refresh operation on a second refresh unit in response to completion of executing the access command, the second refresh unit in a second place of the refresh schedule, wherein the second place follows the first place.

In some embodiments, the method further comprises: re-performing the self-refresh operation in response to completion of the controlled refresh operation performed on the second refresh unit.

In some embodiments, the method further comprises: providing, to the processor, an address associated with the second refresh unit; receiving the address from the processor in response to a receipt of a request to perform the controlled refresh operation; and receiving an instruction to perform the controlled refresh operation on the second refresh unit according to the address.

In some embodiments, the method further comprises: re-performing the self-refresh operation in response to completion of the controlled refresh operation performed on the second refresh unit.

In some embodiments, the method further comprises: actively providing the address to the processor in response to the interruption of the self-refresh operation.

In some embodiments, the method further comprises: passively providing the address to the processor in response to the interruption of the self-refresh operation.

In the present disclosure, the self-refresh operation is able to be interrupted to execute the access command. An operation of a DRAM adopting the method to operate is relatively efficient. Moreover, with the controlled refresh operation, the second refresh unit is able to be promptly refreshed once the access command is executed. As a result, data stored by the second refresh unit, for example, a memory cell of the second refresh unit, is relatively less likely to be lost.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
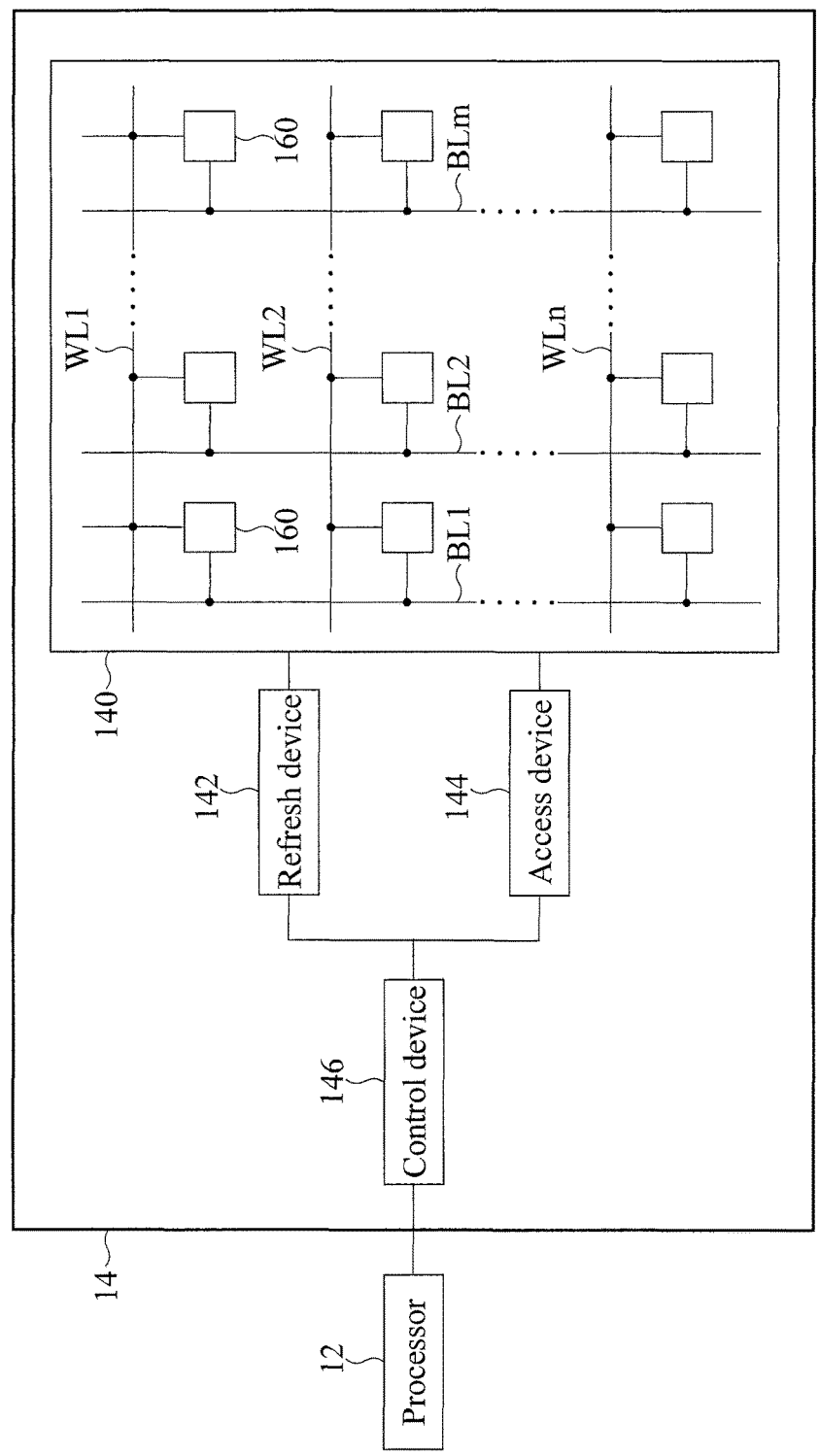
FIG. 1 is a schematic diagram of an electronic system including a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of an electronic system 10 including a dynamic random access memory (DRAM) 14, in accordance with some embodiments of the present disclosure. Referring to FIG. 1, in addition to the DRAM 14, the electronic system 10 further includes a processor 12. The processor 12 functions to control the DRAM 14 by, for example, transmitting commands and/or other information to the DRAM 14. In an embodiment, the processor 12 includes a central processing unit (CPU) or part of a computing module.

The DRAM 14 includes a memory array 140, a refresh device 142, an access device 144 and a control device 146.

The memory array 140 functions to store data. The memory array 140 includes a plurality of memory cells 160 arranged in a two-dimensional array. The memory cell 160 functions to store data. In addition to the memory cells 160, the memory array 140 further includes a plurality of word lines WL1 to WLn and a plurality of bit lines BL1 to BLm, wherein n and m are positive integers. The word lines WL1 to WLn and the bit lines BL1 to BLm are used to control operation of the associated memory cells 160. The memory cells 160 in a single row and a word line for accessing those memory cells 160 can together be deemed as a memory row. For convenience and brevity of discussion, in the embodiments shown in the following figures, the memory cells 160, the word lines WL1 to WLn, and the bit lines BL1 to BLm are not depicted.

The refresh device 142 functions to perform a self-refresh operation on the memory array 140. The self-refresh operation refers to the procedure in which the refresh device 142 automatically executes a refresh operation by, for example, using an internal refresh counter. There is no need for the refresh device 142 to obtain any information from the processor 12 external to the DRAM 14 to perform the self-refresh operation. The refresh device 142 can generate, on its own, any information required to perform the self-refresh operation. Additionally, the refresh device 142 refreshes the memory array 140 in a fashion in which, for example, a charge is read from the memory cell 160, and the charge is immediately written back to the memory cell 160. However, the present disclosure is not limited thereto. The refresh operation may further include other detailed operations.

The access device 144 functions to access the memory array 140, in particular, a memory row of the memory array 140.

The control device 146 functions to control the refresh device 142 and the access device 144. In further detail, the control device 146 functions to interrupt a self-refresh operation being performed by the refresh device 142 in response to an access command, such as a read command, a write command, a burst read command, or a burst write command. Next, the control device 146 controls the access device 144, such that the access device 144 accesses the memory array 140 in response to the interruption of the self-refresh operation and the access command. There is no need to wait for completion of the self-refresh operation to execute the access command. The access command is executed promptly. As a result, operation of the DRAM 10 is relatively efficient.

Figure 2:
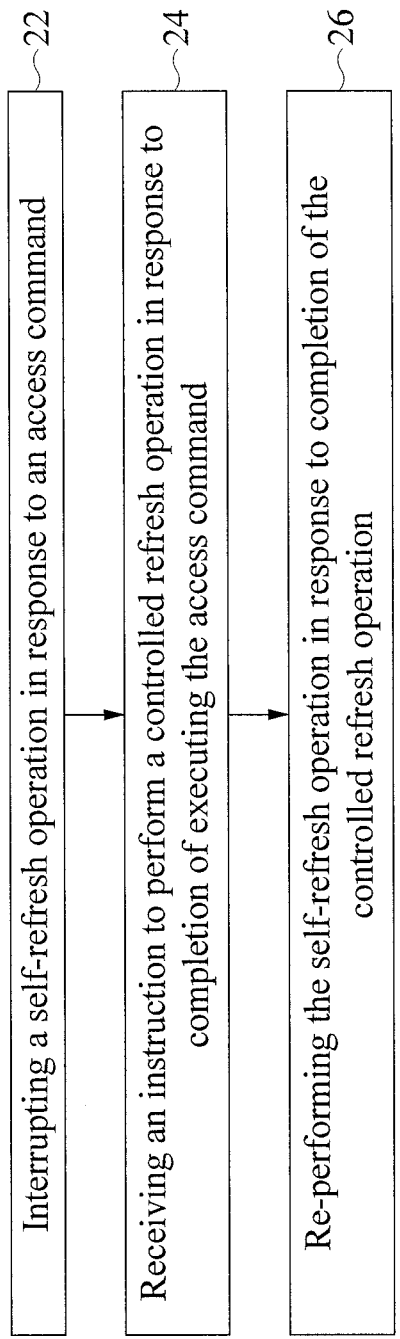
FIG. 2 is a flow chart of a method of operating a DRAM, in accordance with some embodiments of the present disclosure.

FIG. 2 is a flow chart of a method 20 of operating a DRAM, in accordance with some embodiments of the present disclosure. Referring to FIG. 2, the method 20 includes operations 22, 24 and 26.

The method 20 begins with operation 22, in which a self-refresh operation on a memory array is interrupted in response to an access command. Moreover, the memory array is accessed in response to both the interruption of the self-refresh operation and the access command.

The method 20 proceeds to operation 24, in which an instruction is received to perform a controlled refresh operation in response to completion of executing the access command.

The method 20 proceeds to operation 26, in which the self-refresh operation is re-performed in response to completion of the controlled refresh operation.

The method 20 is merely an example, and is not intended to limit the present disclosure beyond what is explicitly recited in the claims. Additional operations can be provided before, during, and after the method 20, and some operations described can be replaced, eliminated, or moved around for additional embodiments of the method.

In the present disclosure, the self-refresh operation is able to be interrupted to execute the access command. An operation of a DRAM adopting the method 20 to operate is relatively efficient. Moreover, since the controlled refresh operation is performed after the completion of executing the access command, a data stored by the DRAM is relatively less likely to be lost.

Figure 3:
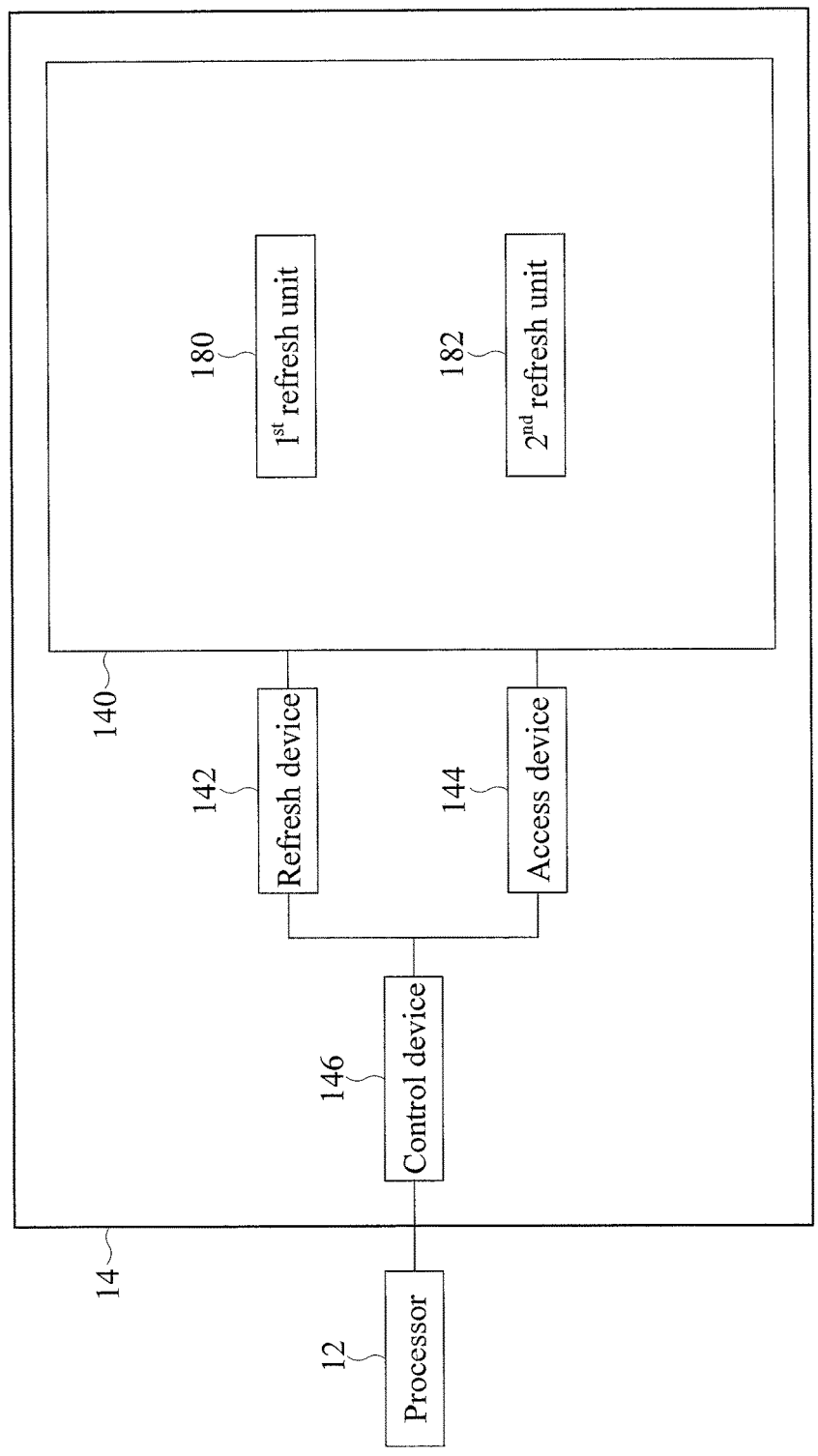
FIG. 3 is a schematic diagram of the electronic system shown in FIG. 1, in accordance with some embodiments of the present disclosure.

FIG. 3 is a schematic diagram of the electronic system 10 shown in FIG. 1, in accordance with some embodiments of the present disclosure. Referring to FIG. 3, the memory array 14 includes a first refresh unit 180 and a second refresh unit 182.

The first refresh unit 180 is in a first place of a refresh schedule. The first refresh unit 180 includes a plurality of memory rows. However, the present disclosure is not limited thereto. In some embodiments, the first refresh unit 180 includes a single memory row. Moreover, in some embodiments, the memory rows of the first refresh unit 180 belong to a single bank. However, the present disclosure is not limited thereto. The memory rows may belong to different banks. That is, the first refresh unit 180 may include a single bank, a plurality of banks, a single memory row, or a plurality of memory rows. The present disclosure is not limited to any specific type as previously mentioned.

The second refresh unit 182 is in a second place, following the first place, of the refresh schedule, which means that the second refresh unit 182 is refreshed after the first refresh unit 180 is refreshed. The second refresh unit 182 includes a plurality of memory rows. However, the present disclosure is not limited thereto. In some embodiments, the second refresh unit 182 includes a single memory row. Moreover, in some embodiments, the memory rows of the second refresh unit 182 belong to a single bank. However, the present disclosure is not limited thereto. The memory rows may belong to different banks. That is, the second refresh unit 182 may include a single bank, a plurality of banks, a single memory row, or a plurality of memory rows. The present disclosure is not limited to any specific type as previously mentioned.

Figure 4:
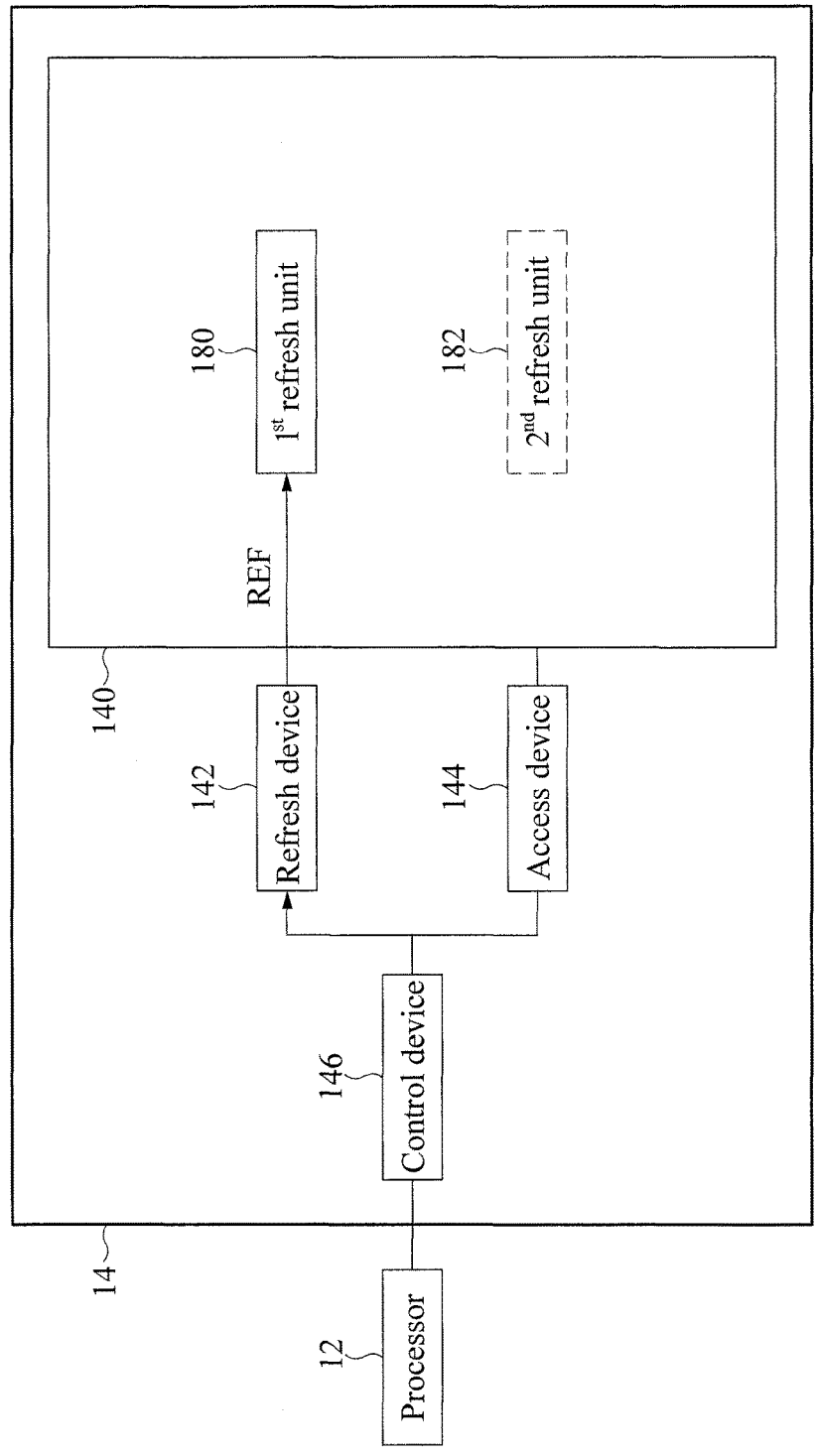
FIG. 4 is a schematic diagram illustrating a self-refresh operation of the DRAM shown in FIG. 3, in accordance with some embodiments of the present disclosure.

FIG. 4 is a schematic diagram illustrating a self-refresh operation of the DRAM 14 shown in FIG. 3, in accordance with some embodiments of the present disclosure. Referring to FIG. 4, in the self-refresh operation, the refresh device 142 automatically and repeatedly refreshes the first refresh unit 180 and the second refresh unit 182. The refresh device 142 are able to, on its own, generate any information required to perform the self-refresh operation.

In a stage shown in FIG. 4, the refresh device 142 refreshes the first refresh unit 180 in the first place, as depicted by a solid frame.

Figure 5:
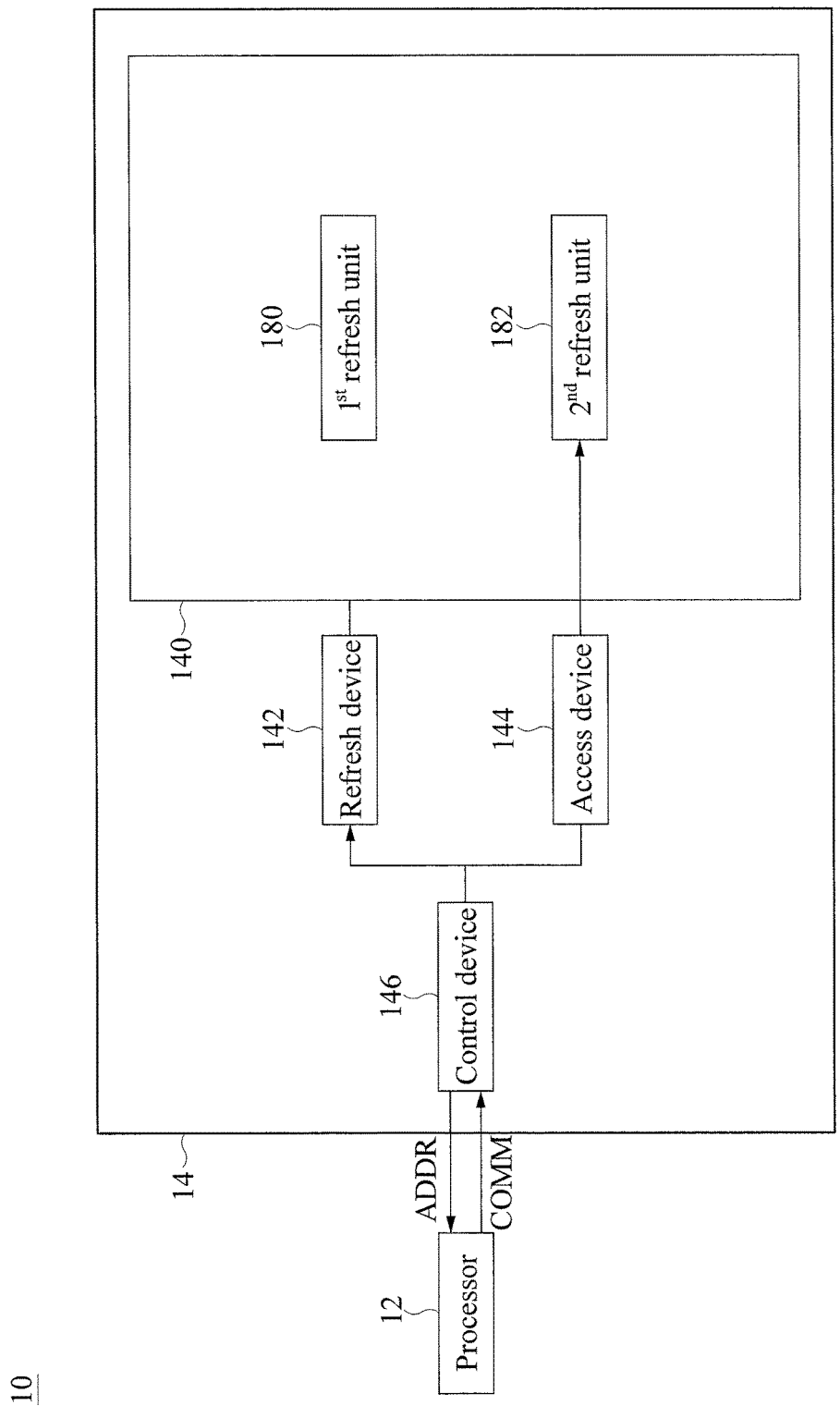
FIG. 5 is a schematic diagram illustrating an access operation of the DRAM shown in FIG. 3, in accordance with some embodiments of the present disclosure.

FIG. 5 is a schematic diagram illustrating an access operation of the DRAM 10 shown in FIG. 3, in accordance with some embodiments of the present disclosure. Referring to FIG. 5, the processor 12 issues an access command COMM to the control device 146. The control device 146 controls the refresh device 142, such that the self-refresh operation is interrupted in response to the access command COMM. In further detail, after the self-refresh operation currently being performed on the first refresh unit 180 is completed, the self-refresh operation is interrupted. In short, the self-refresh operation is interrupted in response to completion of the self-refresh operation currently being performed on the first refresh unit 180.

The control device 146 knows that the first refresh unit 180 was refreshed and the second refresh unit 182 has not been refreshed based on, for example, the refresh schedule. Function of the refresh schedule may be implemented by combinational logic. In some embodiments, the control device 146 actively provides, to the processor 12, an address ADDR associated with the second refresh unit, which has not been refreshed, in response to the interruption of the self-refresh operation. In some embodiments, the control device 146 stores the address ADDR. When the processor 12 requests the address ADDR, the control device 146 provides the address ADDR to the processor 12, which means that the control device 146 passively provides the address ADDR to the processor 12 in response to the interruption of the self-refresh operation and the request from the processor 12. Consequently, the processor 12 takes over a refresh operation on the unrefreshed second refresh unit 182, as will be described with reference to FIG. 6.

The access device 144 accesses the second refresh unit 182 of the memory array 140 in response to both the interruption of the self-refresh operation and the access command COMM. In the present embodiment, the access command COMM requests to access the second refresh unit 182. However, the present disclosure is not limited thereto. In some embodiments, when the access command COMM requests to access the first refresh unit 180, or a memory row of the first refresh unit 180, the access device 144 accesses the first refresh unit 180 in response to the interruption and the access command COMM.

Figure 6:
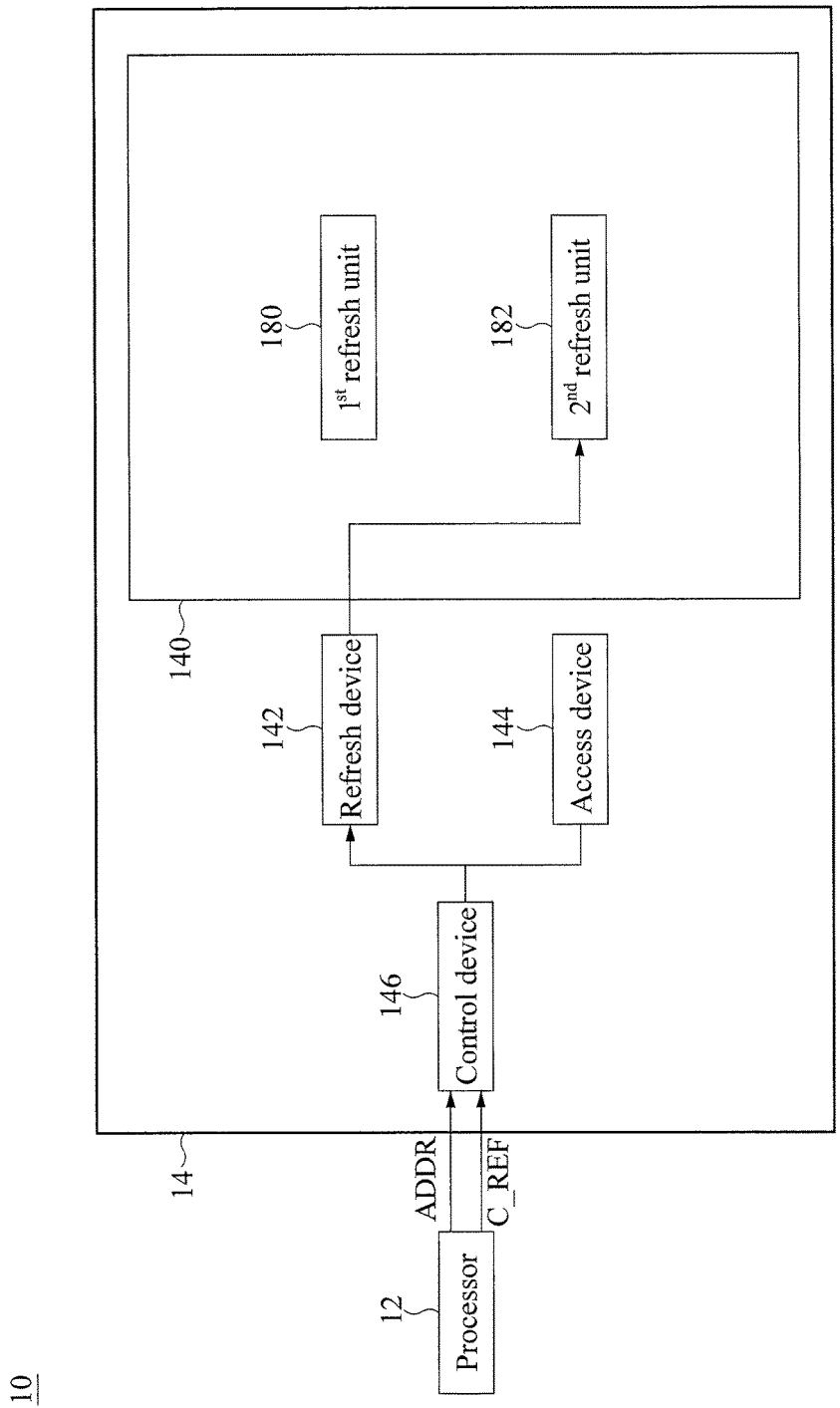
FIG. 6 is a schematic diagram illustrating a controlled refresh operation of the DRAM shown in FIG. 3, in accordance with some embodiments of the present disclosure.

FIG. 6 is a schematic diagram illustrating a controlled refresh operation of the DRAM shown in FIG. 3, in accordance with some embodiments of the present disclosure. Subsequent to the embodiment shown in FIG. 5, the access command COMM has been executed. Referring to FIG. 6, the processor 12 instructs the control device 146 to perform the controlled refresh operation. The control device 146 accordingly controls the refresh device 142. The refresh device 142 is instructed, by the processor 12 external to the DRAM 14, to perform the controlled refresh operation on the second refresh unit 182 in response to completion of executing the access command COMM. In further detail, the control device 146 receives the address ADDR from the processor 12 in response to a receipt of a request C_REF to perform the controlled refresh operation. The refresh device 142 is instructed to perform the controlled refresh operation on the second refresh unit 182 according to the address ADDR. Compared to the self-refresh operation, the refresh device 142 is unable to perform the controlled refresh operation on its own. Information to perform the controlled refresh operation is only able to be provided by the processor 12 or other devices external to the DRAM 14. With the controlled refresh operation, the second refresh unit 182 is able to be promptly refreshed once the access command COMM is executed. As a result, data stored by the second refresh unit 182, for example, a memory cell of the second refresh unit 182, is relatively less likely to be lost.

Figure 7:
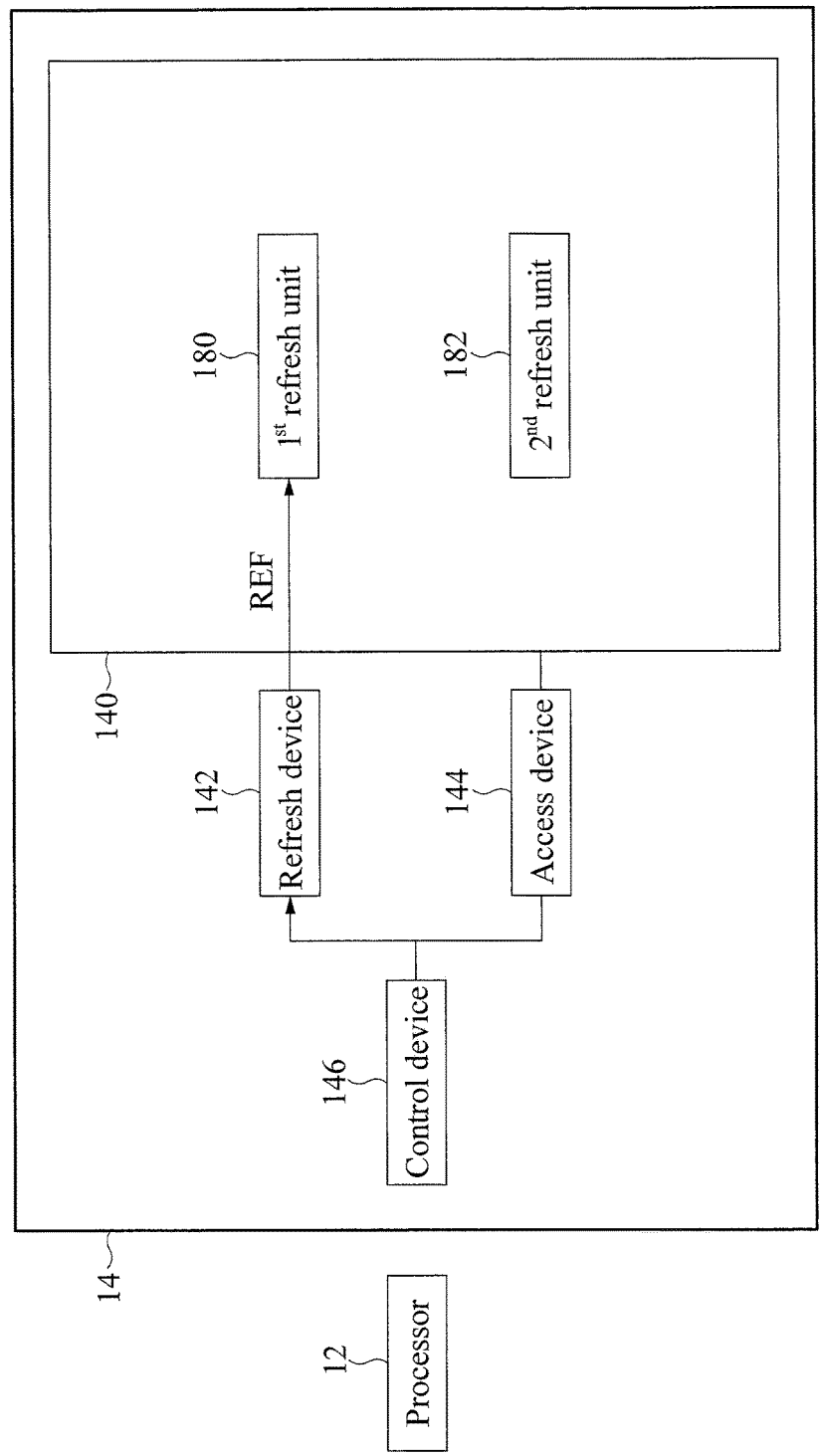
FIG. 7 is a schematic diagram illustrating a re-performed to self-refresh operation of the DRAM shown in FIG. 3, in accordance with some embodiments of the present disclosure.

FIG. 7 is a schematic diagram illustrating the re-performed self-refresh operation of the DRAM 10 shown in FIG. 3, in accordance with some embodiments of the present disclosure. Subsequent to the embodiment shown in FIG. 6, the controlled refresh operation being performed on the second refresh unit 182 is completed. Referring to FIG. 7, the refresh device 142 re-performs the self-refresh operation in response to completion of the controlled refresh operation. In the self-refresh operation as shown in FIG. 7, the refresh device 142 refreshes the first refresh unit 180 in the first place.

Figure 8:
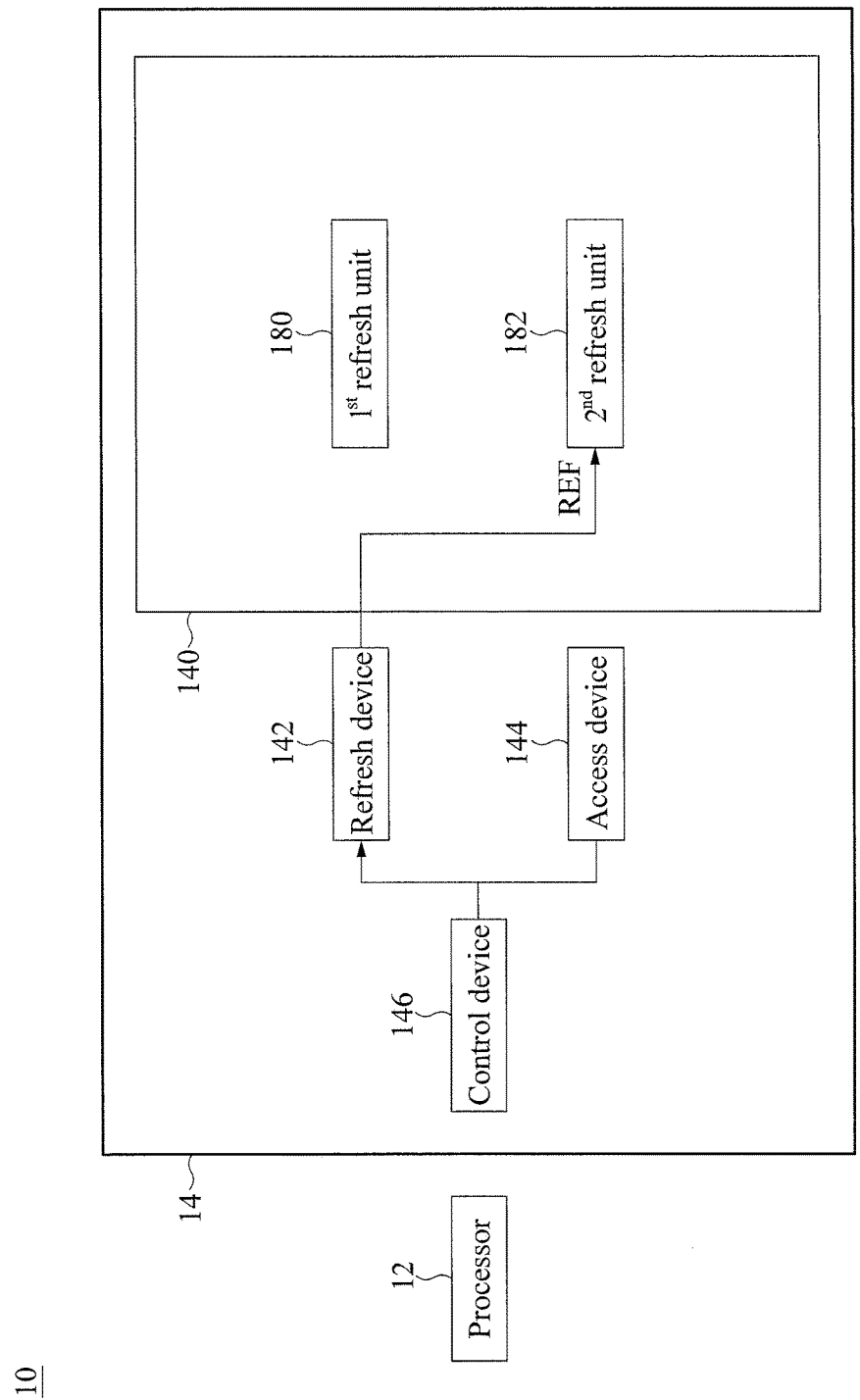
FIG. 8 is a schematic diagram illustrating a re-performed self-refresh operation of the DRAM shown in FIG. 3, in accordance with some embodiments of the present disclosure.

FIG. 8 is a schematic diagram illustrating the re-performed self-refresh operation of the DRAM 10 shown in FIG. 3, in accordance with some embodiments of the present disclosure. Referring to FIG. 7, in the self-refresh operation, after the first refresh unit 180 in the first place is refreshed, the refresh device 142 refreshes the second refresh unit 182.

Figure 9:
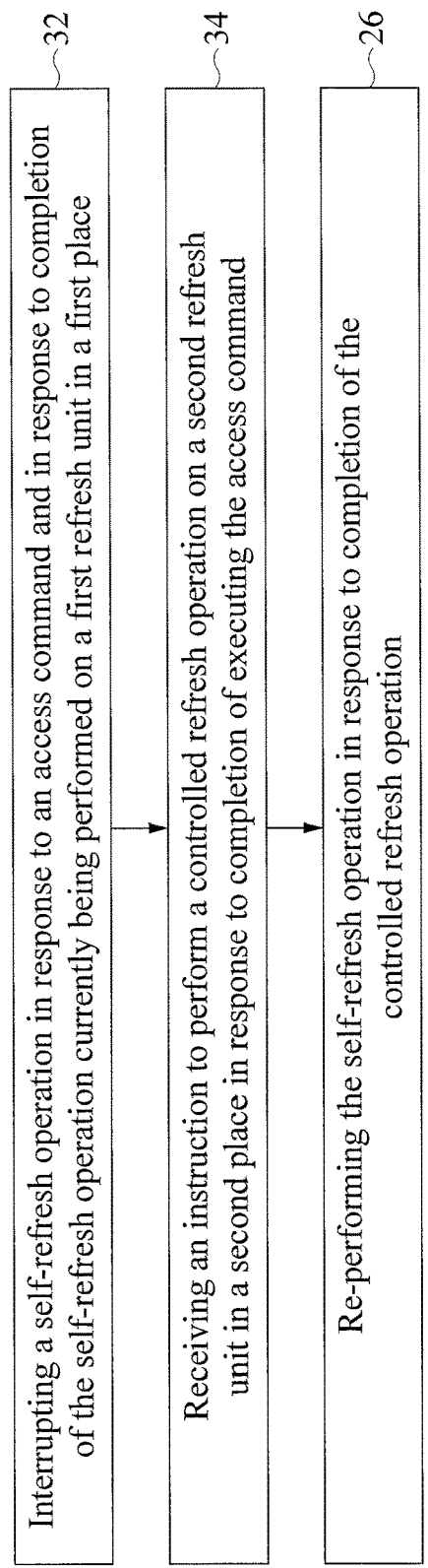
FIG. 9 is a flow chart of another method of operating a DRAM, in accordance with some embodiments of the present disclosure.

FIG. 9 is a flow chart of another method 30 of operating a DRAM, in accordance with some embodiments of the present disclosure. Referring to FIG. 9, the method 30 is similar to the method 20 described and illustrated with reference to FIG. 2 except that, for example, the method 30 includes operations 32 and 34.

The method 30 begins with operation 32, in which a self-refresh operation is interrupted in response to an access command and in response to completion of the self-refresh operation currently being performed on a first refresh unit in a first place. Moreover, a memory array is accessed in response to both the interruption of the self-refresh operation and the access command.

The method 30 proceeds to operation 34, in which an instruction is received to perform a controlled refresh operation on a second refresh unit in a second place in response to completion of executing the access command.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

In the present disclosure, the self-refresh operation is able to be interrupted to execute the access command. An operation of a DRAM adopting the method 30 to operate is relatively efficient. Moreover, since the controlled refresh operation is performed after the completion of executing the access command, a data stored by the second refresh unit is relatively less likely to be lost.

Figure 10:
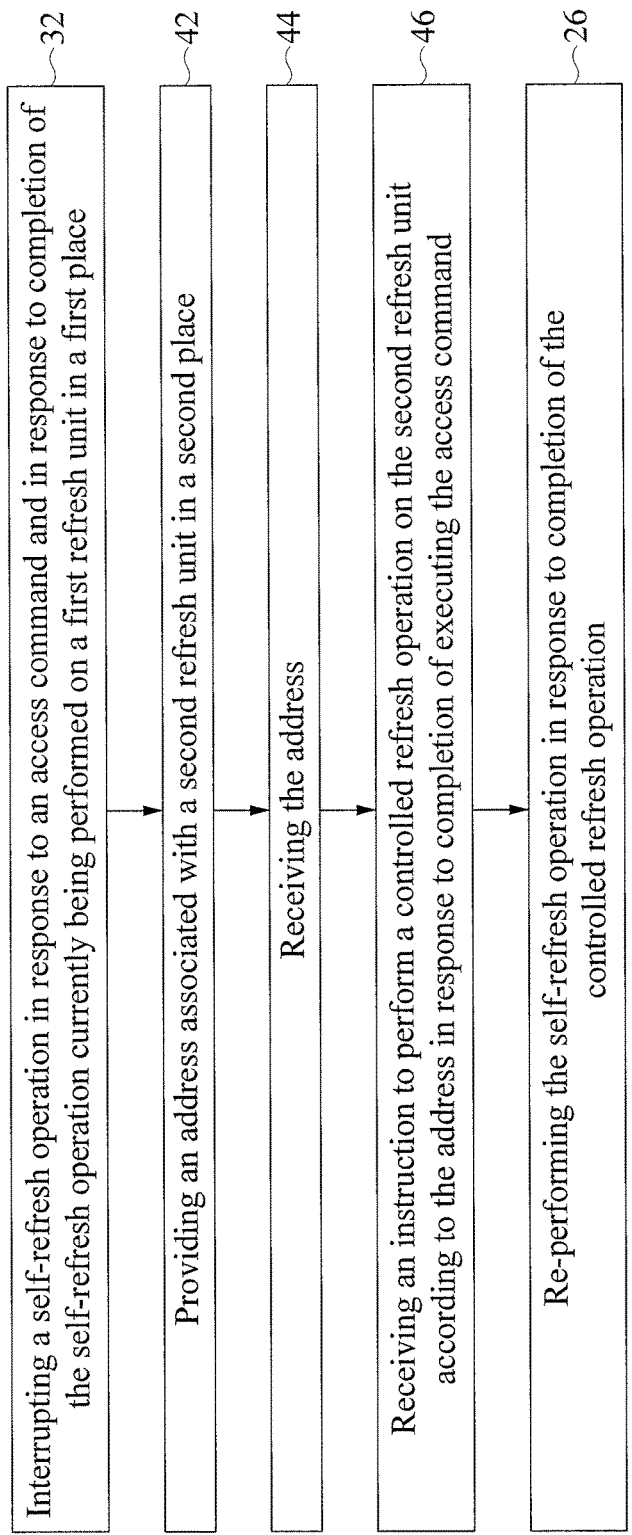
FIG. 10 is a flow chart of still another method of operating a DRAM, in accordance with some embodiments of the present disclosure.

FIG. 10 is a flow chart of still another method 40 of operating a DRAM, in accordance with some embodiments of the present disclosure. Referring to FIG. 10, the method 40 is similar to the method 30 except that, for example, the method 40 further includes operations 42, 44 and 46.

In operation 42, an address associated with a second refresh unit in a second place is provided to a processor external to the DRAM.

The method 40 proceeds to operation 44, in which the address is received from the processor in response to a receipt of a request to perform a controlled refresh operation.

The method 40 continues with operation 46, in which an instruction is received to perform a controlled refresh operation on the second refresh unit according to the address in response to completion of executing the access command.

In the present disclosure, there is no need to wait for completion of the self-refresh operation to execute the access command COMM. The access command COMM is executed promptly. As a result, operation of the DRAM 10 is relatively efficient. Moreover, with the controlled refresh operation, the second refresh unit 182 is able to be promptly refreshed once the access command COMM is executed. As a result, data stored by the second refresh unit 182, for example, a memory cell of the second refresh unit 182, is relatively less likely to be lost.

One aspect of the present disclosure provides a DRAM. The DRAM comprises a memory array, a refresh device and an access device. The refresh device is configured to perform a self-refresh operation on the memory array, wherein the self-refresh operation is interrupted in response to an access command. The access device is configured to access the memory array in response to the access command.

Another aspect of the present disclosure provides a method of operating a dynamic random access memory (DRAM). The method comprises: performing a self-refresh operation on a memory array; interrupting the self-refresh operation in response to an access command; and accessing the memory array in response to the access command.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
    a memory array including a first refresh unit in a first place of a refresh schedule and a second refresh unit in a second place of the refresh schedule, wherein the second place follows the first place;
    a refresh device configured to perform a self-refresh operation on memory array, wherein the self-refresh operation is interrupted in response to both an access command and completion of the self-refresh operation currently being performed on the first refresh unit; and
    an access device configured to access the second refresh unit of the memory array in response to both the interruption of the self-refresh operation and the access command;
    wherein the refresh device is further configured to be instructed to perform a controlled refresh operation on the second refresh unit in response to completion of executing the access command.

2. The DRAM of claim 1,
    wherein the refresh device is configured to be instructed by a processor external to the DRAM.

3. The DRAM of claim 2, wherein the refresh device is configured to re-perform the self-refresh operation in response to completion of the controlled refresh operation performed on the second refresh unit.

4. The DRAM of claim 2, wherein the DRAM is configured to provide, to the processor, an address associated with the second refresh unit, and configured to receive the address from the processor in response to a receipt of a request to perform the controlled refresh operation,
    wherein the refresh device is further configured to be instructed to perform the controlled refresh operation on the second refresh unit according to the address.

5. The DRAM of claim 4, wherein the refresh device is configured to re-perform the self-refresh operation in response to completion of the controlled refresh operation performed on the second refresh unit.

6. The DRAM of claim 4, further comprising:
    a control device configured to actively provide the address to the processor in response to the interruption of the self-refresh operation.

7. The DRAM of claim 4, further comprising:
    a control device configured to passively provide the address to the processor in response to the interruption of the self-refresh operation.

8. A method of operating a dynamic random access memory (DRAM), the method comprising:
    performing a self-refresh operation on a memory array including a first refresh unit in a first place of a refresh schedule and a second refresh unit in a second place of the refresh schedule, wherein the second place follows the first place;
    interrupting the self-refresh operation in response to both an access command and completion of the self-refresh operation currently being performed on the first refresh unit in the first place of the refresh schedule;
    accessing the second refresh unit of the memory array in response to both the interruption of the self-refresh operation and the access command; and
    receiving an instruction to perform a controlled refresh operation on the second refresh unit in response to completion of executing the access command.

9. The method of claim 8, wherein
the instruction is from a processor external to the DRAM.

10. The method of claim 9, further comprising:
re-performing the self-refresh operation in response to completion of the controlled refresh operation performed on the second refresh unit.

11. The method of claim 9, further comprising:
providing, to the processor, an address associated with the second refresh unit;
receiving the address from the processor in response to a receipt of a request to perform the controlled refresh operation; and
receiving an instruction to perform the controlled refresh operation on the second refresh unit according to the address.

12. The method of claim 11, further comprising:
re-performing the self-refresh operation in response to completion of the controlled refresh operation performed on the second refresh unit.

13. The method of claim 11, further comprising:
actively providing the address to the processor in response to the interruption of the self-refresh operation.

14. The method of claim 11, further comprising:
passively providing the address to the processor in response to the interruption of the self-refresh operation.

* * * * *